US007978518B2

(12) United States Patent
Pyeon et al.

(10) Patent No.: US 7,978,518 B2
(45) Date of Patent: Jul. 12, 2011

(54) HIERARCHICAL COMMON SOURCE LINE STRUCTURE IN NAND FLASH MEMORY

(75) Inventors: Hong-Beom Pyeon, Kanata (CA); Jin-Ki Kim, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 153 days.

(21) Appl. No.: 12/337,038

(22) Filed: Dec. 17, 2008

(65) Prior Publication Data

US 2009/0161437 A1 Jun. 25, 2009

Related U.S. Application Data

(60) Provisional application No. 61/015,909, filed on Dec. 21, 2007.

(51) Int. Cl.
*G11C 16/04* (2006.01)

(52) U.S. Cl. .............. 365/185.17; 365/226; 365/185.18; 365/185.11; 365/185.23

(58) Field of Classification Search ............. 365/185.17, 365/226, 185.18, 185.11, 185.23
See application file for complete search history.

(56) References Cited

U.S. PATENT DOCUMENTS 5,748,531 A 5/1998 Choi
5,781,477 A 7/1998 Rinerson et al.
5,808,935 A * 9/1998 Kwon et al. ............ 365/185.17
5,945,717 A 8/1999 Chevallier
6,175,522 B1 1/2001 Fang
6,285,599 B1 9/2001 Shimada et al.
6,674,120 B2 1/2004 Fujiwara
6,721,231 B2 4/2004 Tomohiro
6,856,571 B2 2/2005 Lakhani et al.
6,870,765 B2 3/2005 Fujiwara
6,914,813 B2 7/2005 Chevallier et al.
6,925,009 B2 8/2005 Noguchi et al.

(Continued)

FOREIGN PATENT DOCUMENTS

EP 0608075 A2 7/1994

(Continued)

OTHER PUBLICATIONS

Ken Takeuchi, Shinji Satoh, Ken-Ichi Imamiya, and Koji Sakui, A Source-Line Programming Scheme for Low-Voltage Operation NAND Flash Memories, IEEE Journal of Solid-State Circuits, vol. 35, No. 5 May 2000, Microelectronics Engineering Laboratory, Toshiba Corporation, Japan.

(Continued)

*Primary Examiner* — Hoai V Ho
*Assistant Examiner* — Fernando N Hidalgo
(74) *Attorney, Agent, or Firm* — Ridout & Maybee LLP

(57) ABSTRACT

Each memory cell string in a generic NAND flash cell block connects to a Common Source Line (CLS). A value for applying to the CSL is centrally generated and distributed to a local switch logic unit corresponding to each NAND flash cell block. For source-line page programming, the distribution line may be called a Global Common Source Line (GCSL). In an array of NAND flash cell blocks, only one NAND flash cell block is selected at a time for programming. To reduce power consumption, only the selected NAND flash cell block receives a value on the CSL that is indicative of the value on the GCSL. Additionally, the CSLs of non-selected NAND flash cell blocks may be disabled through an active connection to ground.

20 Claims, 10 Drawing Sheets

NAND FLASH CELL BLOCK 202
ROW DEC. & WLD 210
LOC. S.L 208
ROW PRE-DECODER 212
GLOBAL SWITCH LOGIC 204
GCSL
SOURCE LINE POWER GENERATOR 206
200

U.S. PATENT DOCUMENTS

| | | | | |
|---|---|---|---|---|
| 7,035,129 | B1 | 4/2006 | Khanuja | |
| 7,126,854 | B2 | 10/2006 | Park | |
| 7,242,616 | B2 | 7/2007 | Takeuchi | |
| 7,259,990 | B2 | 8/2007 | Maejima et al. | |
| 7,269,063 | B2 | 9/2007 | Chih | |
| 7,272,048 | B2 | 9/2007 | Kang et al. | |
| 7,298,647 | B2 | 11/2007 | Li et al. | |
| 2005/0232012 | A1 | 10/2005 | Park | |
| 2005/0275004 | A1 | 12/2005 | Watanabe | |
| 2007/0230253 | A1* | 10/2007 | Kim | 365/185.29 |
| 2008/0106924 | A1* | 5/2008 | Cho et al. | 365/148 |

FOREIGN PATENT DOCUMENTS

| | | | |
|---|---|---|---|
| JP | 407006593 | A * | 1/1995 |
| WO | 2007109883 | A1 | 10/2007 |

OTHER PUBLICATIONS

EPO, Extended European Search Report relating to EP application No. 08865169.0 dated Dec. 16, 2010.

Toru Tanzawa et al, "Circuit Techniques for a 1.8-V-Only NAND Flash Memory", IEEE Journal of Solid-State Circuits, IEEE Service Center, Piscataway, NJ, US, vol. 37, No. 1, Jan. 1, 2002.

* cited by examiner

HIERARCHICAL COMMON SOURCE LINE STRUCTURE IN NAND FLASH MEMORY

RELATED APPLICATIONS

The present application claims priority from U.S. provisional Patent Application No. 61/015,909, filed Dec. 21, 2007, which is incorporated herein by reference in its entirety.

FIELD OF THE INVENTION

The present application relates generally to NAND flash memory and, more specifically, to a Hierarchical Common Source Line Structure for such memory.

BACKGROUND OF THE INVENTION

NAND flash memory has been proposed as a main storage element to replace hard disk drives, which have been used for a long time in the Personal Computer (PC) systems and servers. NAND flash memory uses "tunnel injection" for writing and "tunnel release" for erasing. Such writing and erasing makes use of a quantum tunneling effect, also called Fowler-Nordheim tunnel injection, wherein charge carriers are injected into an electric conductor through a thin layer of an electric insulator (a gate oxide).

Recent expansion in the use of NAND flash memory in the semiconductor memory system may be, at least in part, attributed to a relatively low power consumption feature that makes NAND flash memory particularly suitable for mobile products.

NAND flash memory is arranged as strings of flash memory cells. Associated with each NAND memory cell string is a bit line. Running across the NAND memory cell strings are word lines. Accordingly, through selection of, i.e., application of an appropriate voltage on, a particular bit line and a particular word line, a particular flash memory cell may be selected for writing.

When programming a flash memory cell, a program voltage is applied to a control gate of the flash memory cell and the bit line, associated with the NAND memory cell string that includes the flash memory cell, is grounded. Electrons from a p-well are injected into a floating gate of the flash memory cell. When electrons accumulate in the floating gate, the floating gate becomes negatively charged and the threshold voltage of the flash memory cell is raised. To apply the program voltage to the control gate of the flash memory cell being programmed, that program voltage is applied on the appropriate word line. The word line is also connected to a control gate of one flash memory cell in each of the other NAND memory cell strings that utilize the same word line. A problem arises when it is desired to program one flash memory cell on a word line without programming the other flash memory cells connected to the same word line. Because the program voltage is applied to the control gate of all flash memory cells connected to a word line, an unselected flash memory cell (a flash memory cell that is not to be programmed) on the word line, especially a flash memory cell adjacent to the flash memory cell selected for programming, may become inadvertently programmed. The unintentional programming of the unselected flash memory cell on the selected word line is referred to as "program disturb".

Several techniques can be employed to prevent program disturb. In one method, known as "self boosting", the bit lines that are not selected are electrically isolated and a pass voltage (e.g., 10 volts) is applied to the word lines that are not selected during programming. The unselected word lines couple to the unselected bit lines, causing a voltage (e.g., eight volts) to exist in the channel of the unselected bit lines, thereby tending to reduce program disturb. Self boosting causes a voltage boost to exist in the channel. The voltage boost tends to lower the voltage across the tunnel oxide and reduce program disturb.

Recent improvements in process technology have allowed for smaller transistors and a reduction in the main supply voltage ($V_{DD}$) level. Such a reduction in $V_{DD}$ level acts to prevent transistor destruction due to the high electrical stress for the thin gate oxide tunneling operation.

However, the reduction in $V_{DD}$ level has reduced the usefulness of the self-boosting programming method described above wherein unselected bit lines are electrically isolated. To prevent program disturb in the channel of the flash memory cell connected to the word line to which a program high voltage ($V_{pgm}$) has been applied, an associated program inhibit bit line voltage (at least $V_{DD}$) should be held as high as possible.

BRIEF DESCRIPTION OF THE DRAWINGS

Further features and advantages of the embodiments will become apparent from the following detailed description, taken in combination with the appended drawings, in which.

DETAILED DESCRIPTION OF THE EMBODIMENTS

In order to resolve the problem of a desired high $V_{CC}$ in the low power and low voltage operations of NAND flash memory, "A Source-Line Programming Scheme For Low-Voltage Operation NAND Flash Memories", Journal of Solid State Circuits, Vol. 35 No. 5, May 2000, has been introduced by Ken Takeuchi et al. (hereinafter "Takeuchi").

Figure 5A:
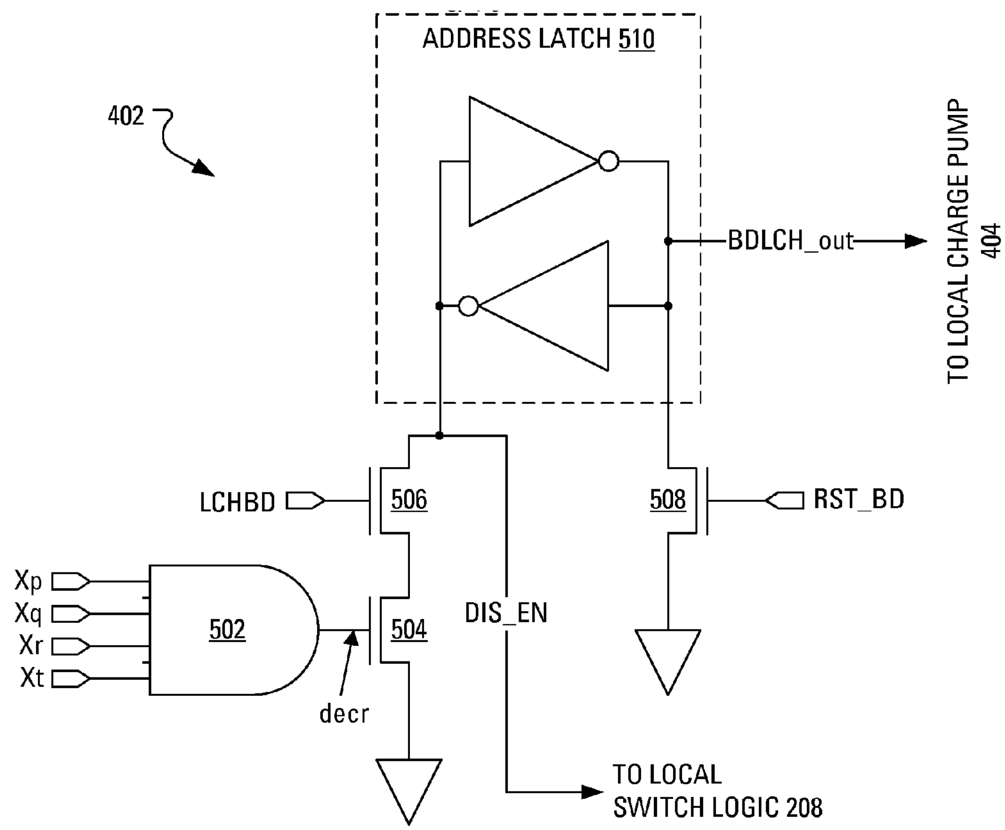
FIG. 5A is a schematic diagram of the row decoder of FIG. 4.
Figure 5:
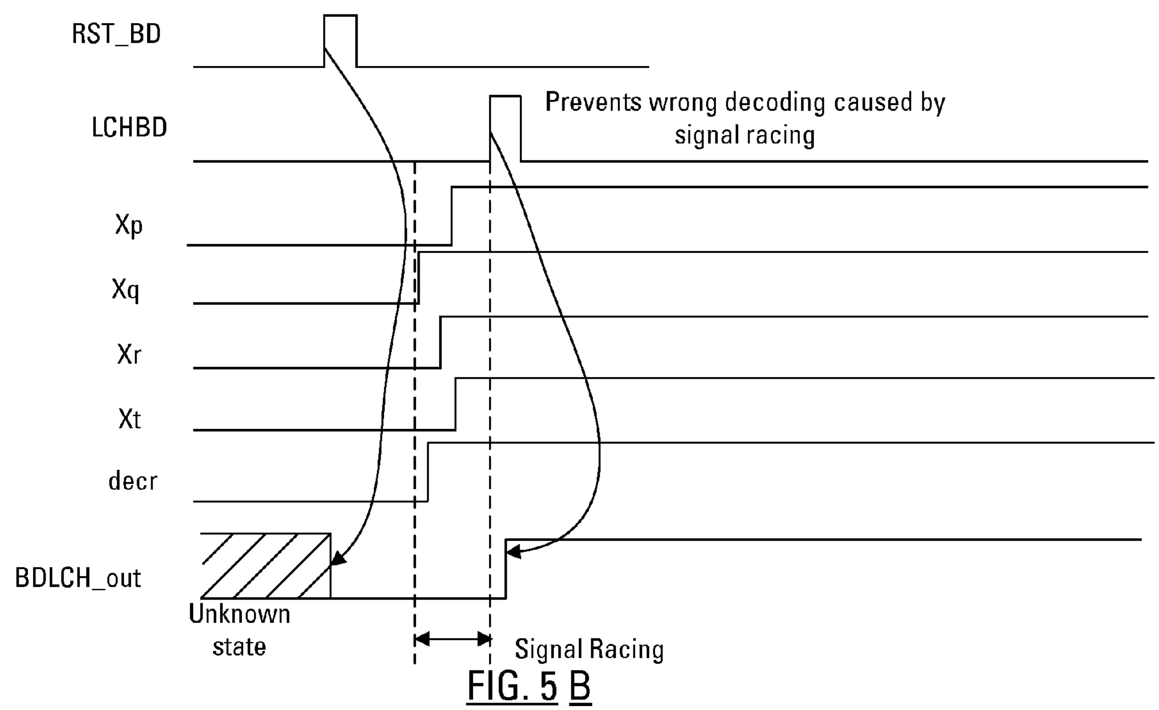
FIG. 5B is a timing diagram of the row decoder of FIG. 4.

The program disturb time shown in FIG. 5 of Takeuchi is defined as when the $V_{th}$ is shifted by 1.5V. The selected cell programming is done by 0V bit line and then it is programmed to have high $V_{th}$ value as programmed state (logically, "0"). Therefore, the self-boosting level of the unselected cell transistor channel is very important to suppress the program disturb by the identical word line connection which have the high program voltage (see FIG. 2 of Takeuchi). However, Takeuchi didn't provide for a higher self-boosting level in the unselected cell transistor channel.

In U.S. application Ser. No. 11/026,825, "Source Side Asymmetrical Precharge Programming Scheme", filed Feb. 6, 2008 by the present applicant, the present inventors presented a method of programming a NAND memory cell string so as to reduce program disturb and $V_{pass}$ disturb. The contents of U.S. application Ser. No. 11/026,825 are hereby incorporated herein by reference.

The method includes asymmetrically pre-charging a NAND string from a positively biased source line while the bit line is decoupled from the NAND string, followed by the application of a programming voltage to the selected memory cell and then followed by the application of bit line data. After asymmetric pre-charging and application of the programming voltage, all the selected memory cells will be set to a program inhibit state as they will be decoupled from the other memory cells in their respective NAND strings and their channels will be locally boosted to a voltage effective for inhibiting programming. A $V_{SS}$ biased bit line will discharge the locally boosted channel to $V_{SS}$, thereby allowing programming of the selected memory cell to occur. A $V_{DD}$ biased bit line will have no effect on the pre-charged NAND string, thereby maintaining a program inhibited state of the memory cells in the NAND string.

Figure 1:
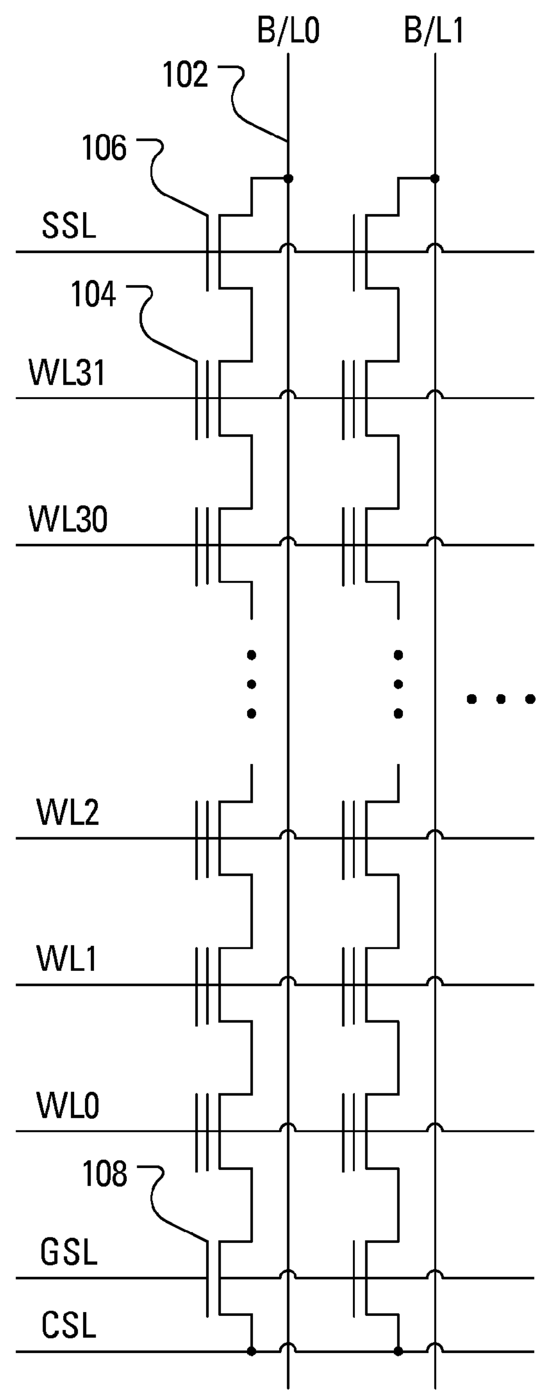
FIG. 1 illustrates a pair of NAND memory cell strings.

FIG. 1 illustrates two NAND memory cell strings. As can be seen in FIG. 1, an example NAND memory cell string (seen on the left) includes a bit line 102 and a selection of 32 serial-connected floating gate memory cells, the floating gate of each of the floating gate memory cells being connected to respective word lines, referenced as WL0, WL1, WL2, . . . , WL30, WL31. An example floating gate memory cell, topmost among the 32 serial-connected floating gate memory cells, is indicated by reference numeral 104. The example NAND memory cell string also includes a string selector transistor 106 having a drain connected to the bit line 102 and a source connected to the drain of the example floating gate memory cell 104. The gate of the string selector transistor 106 is connected to a string selection line (SSL).

The example NAND memory cell string includes a ground select transistor 108 with a drain connected to the source of the bottommost floating gate memory cell among the 32 serial-connected floating gate memory cells. The source of the ground select transistor 108 is connected to a local Common Source Line (CSL). The gate of the ground select transistor 108 is connected to a Ground Select Line (GSL).

Typically, NAND memory cell strings are assembled into blocks, where, for a given block, each NAND memory cell string shares the word lines, the Ground Select Line, the local Common Source Line and the String Selection Line. Such blocks are then arranged in arrays of blocks.

It is known to control the CSL signal level from a main core control block of which there may be only one for an entire block array. In such cases, the CSL signal is transmitted to all blocks in the array. Such a CSL may be called a Global Common Source Line (GCSL). U.S. Pat. No. 6,914,813, "Segmented Non-Volatile Memory Block With Multiple Sources Having Improved Source Line Decode Circuitry" to Chavallier et al. (hereinafter "Chavallier") discloses a global source line and local source line. Chavallier discloses providing distinct source lines to distinct blocks.

Figure 9:
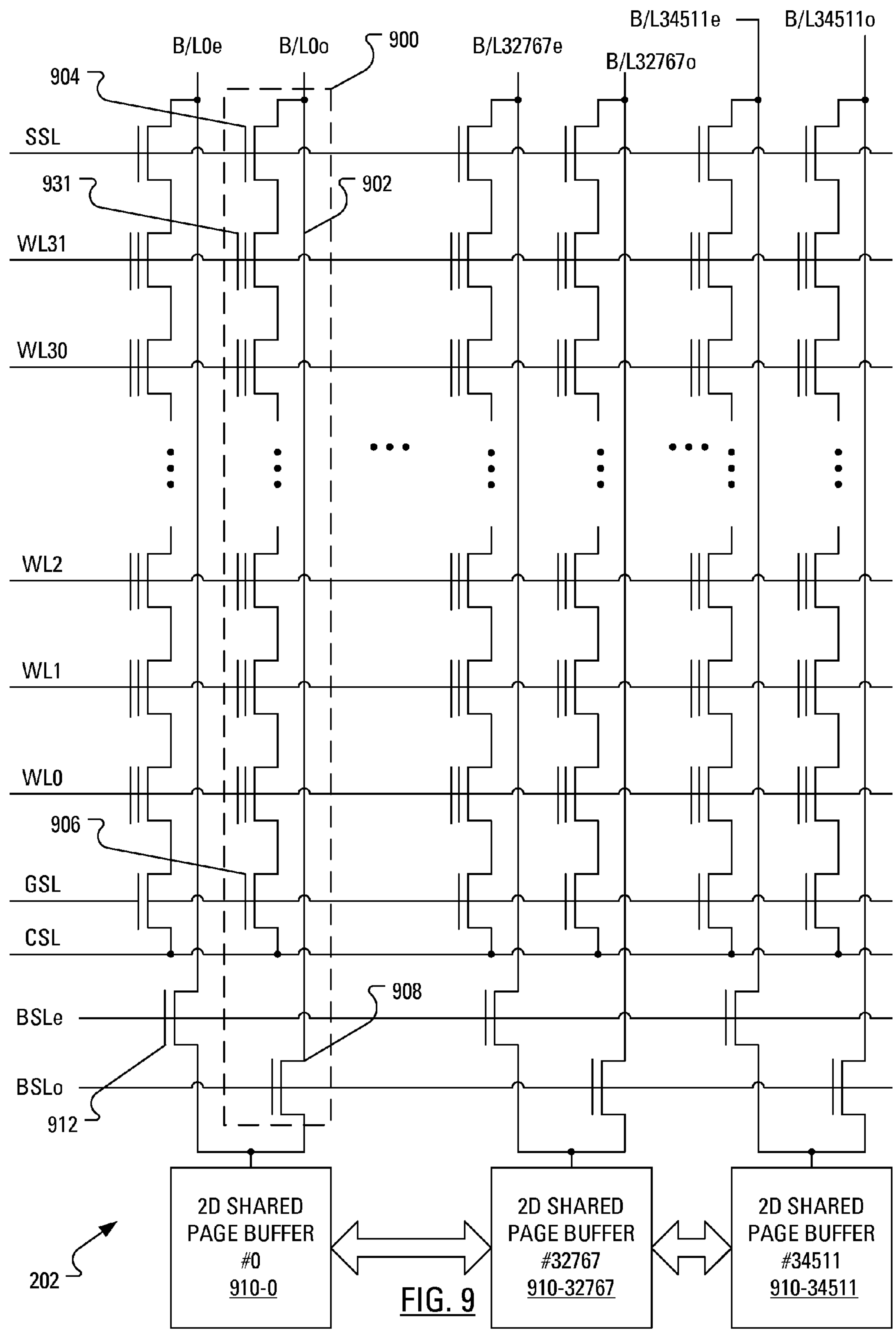
FIG. 9 illustrates elements of the NAND flash cell block of FIG. 3.

FIG. 9 of Chavallier shows the local source line control and conceptual global and local source line structure for page program operation when one of the word lines on a selected block is biased with $V_{pgm}$ and the remaining word lines of the selected block are biased with $V_{pass}$. However, Chavallier does not provide logic combinations adequate for use in a source-line programming scheme.

When a source-line programming scheme is used in NAND flash memories, a GCSL level is transmitted to all blocks in an array. Accordingly, when a GCSL level change operation occurs, for example, after a program operation, the switching of the GCSL level from a high voltage to ground in every block in the array takes time and consumes power.

Figure 8:
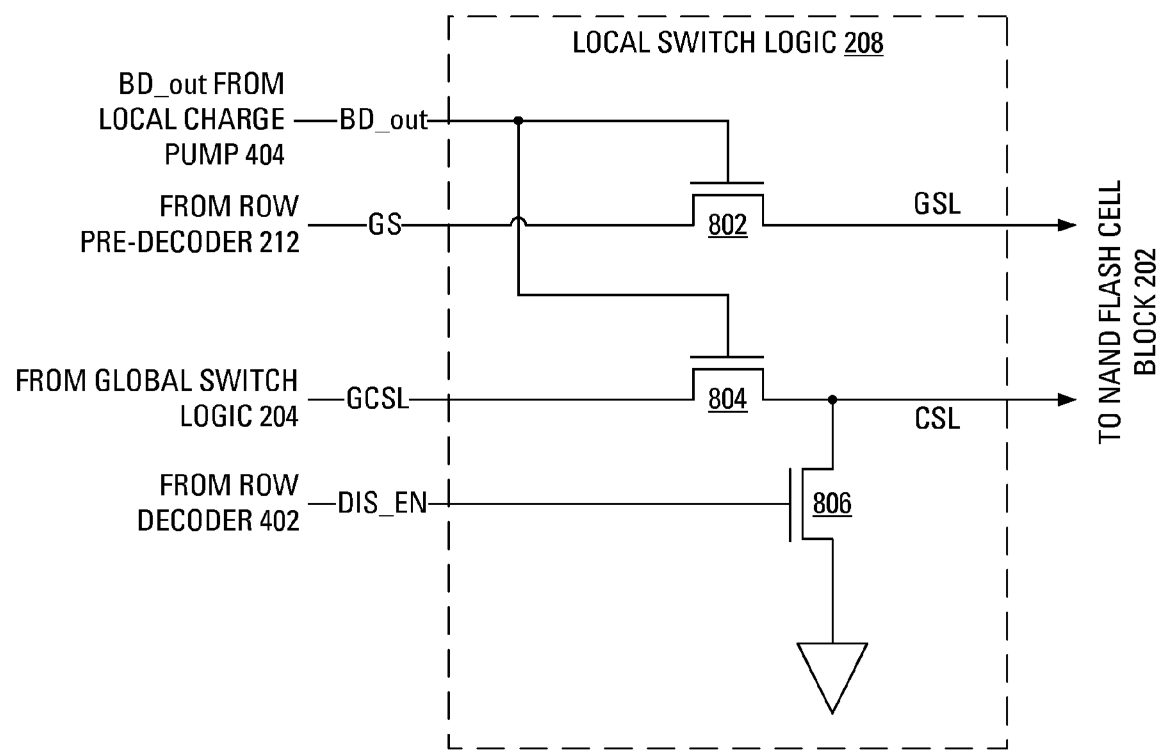
FIG. 8 is a block diagram of the local switch logic unit of FIG. 3.

In one embodiment, each NAND flash cell block of a plurality of NAND flash cell blocks is associated with a local switch logic unit. The local switch logic unit acts to gate the GCSL level to only transmit the GCSL level to the associated NAND flash cell block when the associated NAND flash cell block is the selected NAND flash cell block. As shown in FIG. 8, a local switch logic unit 208 according to one embodiment includes two transistors (802, 804) that are not normally present. After adding the proposed logic, the power consumption from the source-line programming may be reduced.

According to one embodiment, there is provided a local switch logic unit for reducing power consumption from source-line page programming in a block of NAND flash memory strings, the NAND flash memory strings connected to a local common source line. The local switch logic unit includes a first semiconductor switch for selectively allowing passage of a signal received on a global common source line to the block of NAND flash memory strings on the local common source line and a second semiconductor switch for selectively placing a predetermined voltage on the local common source line.

According to another embodiment, there is provided a method of reducing power consumption from source-line page programming in a block of NAND flash memory strings, the NAND flash memory strings connected to the local common source line. The method includes receiving an indication of selection of the block of NAND flash memory strings and, responsive to receiving the indication of selection, permitting passage of a signal received on a global common source line to the block of NAND flash memory strings on the local common source line. The method further includes receiving an enable indication and, responsive to receiving the enable indication, isolating the local common source line from a predetermined voltage.

According to a further embodiment, there is provided a method of reducing power consumption from source-line page programming in a block of NAND flash memory strings, the NAND flash memory strings connected to the local common source line. The method includes receiving an indication that the block of NAND flash memory strings has not been selected and, responsive to receiving the indication, isolating a global common source line from the local common source line of the block of NAND flash memory strings. The method further includes receiving a disable indication and, responsive to receiving the disable indication, connecting the local common source line to a predetermined voltage.

According to a still further embodiment, there is provided a memory array. The memory array includes a NAND flash cell block, the NAND flash cell block including a plurality of NAND flash memory strings, each NAND flash memory string of the plurality of NAND flash memory strings connected to a local common source line, and a local switch logic unit. The local switch logic unit includes a first semiconductor switch for selectively allowing passage, on the local common source line, of a signal to the plurality of NAND flash memory strings in the NAND flash cell block, wherein the signal is received on a global common source line and a second semiconductor switch for selectively placing a predetermined voltage on the local common source line.

Other aspects and features of the present invention will become apparent to those of ordinary skill in the art upon review of the following description of specific embodiments of the invention in conjunction with the accompanying figures.

Figure 2:
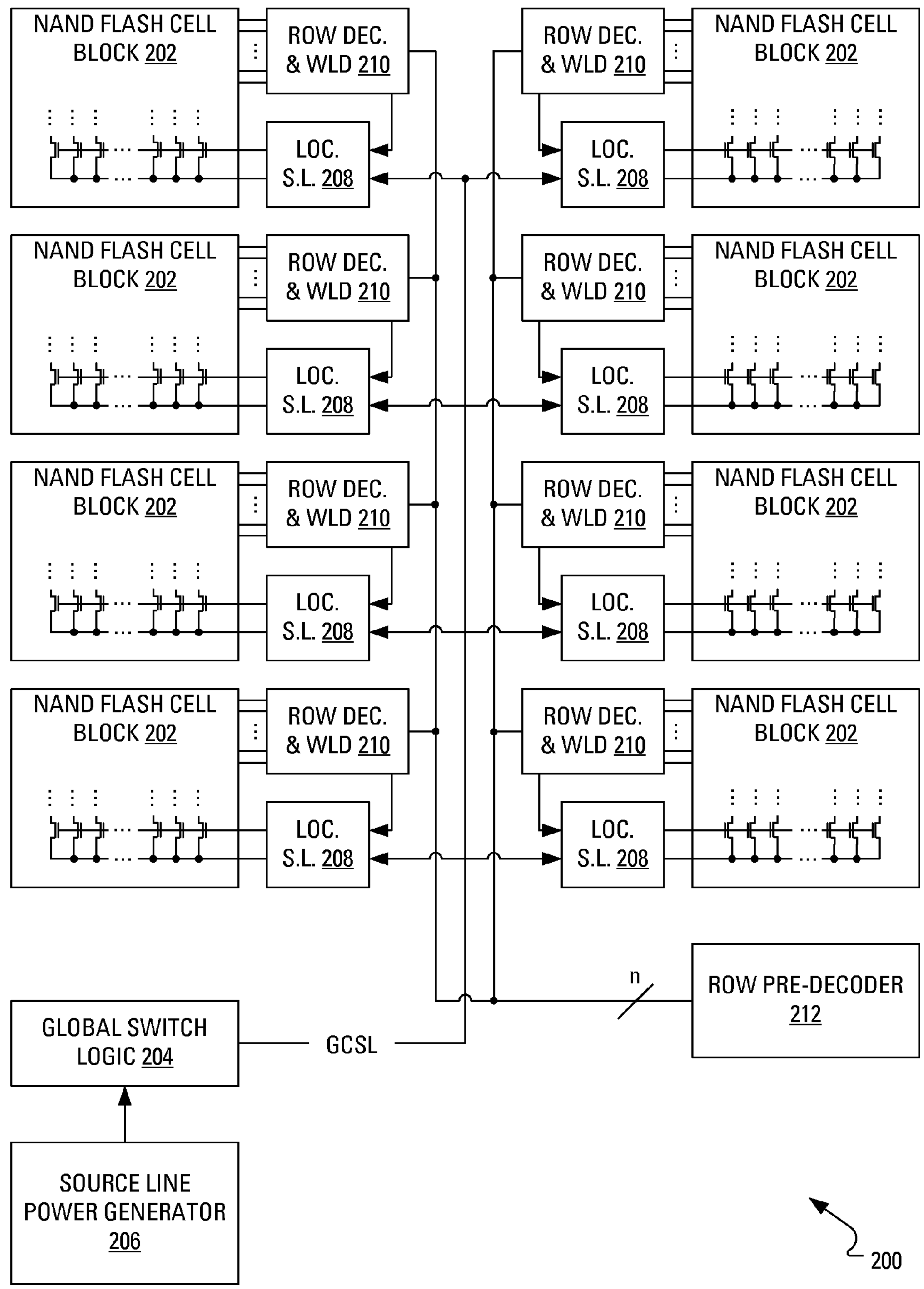
FIG. 2 is a block diagram of a hierarchical common source-line structure including a plurality of NAND flash cell blocks according to an embodiment, each NAND flash cell block is associated with a local switch logic unit and a combined row decoder and word line driver.

FIG. 2 illustrates an example array 200 of NAND flash cell blocks 202. As will be clear to a person of ordinary skill in the art, the array 200 is simplified for ease of illustration. Known arrays of NAND flash cell blocks consist of at least 2048 NAND flash cell blocks in a single array or plane structure. Each NAND flash cell block 202 is associated with, and receives input from, a local switch logic unit 208 and a combination row decoder and word line driver 210. Notably, each local switch logic unit 208 is communicatively connected to the corresponding row decoder and word line driver 210. The array 200 also includes a global switch logic unit 204 which receives input from a source line power generator 206 and is communicatively connected to each of the local switch logic units 208. Additionally, a row pre-decoder 212 is communicatively connected to each of the combination row decoder and word line drivers 210.

Figure 3:
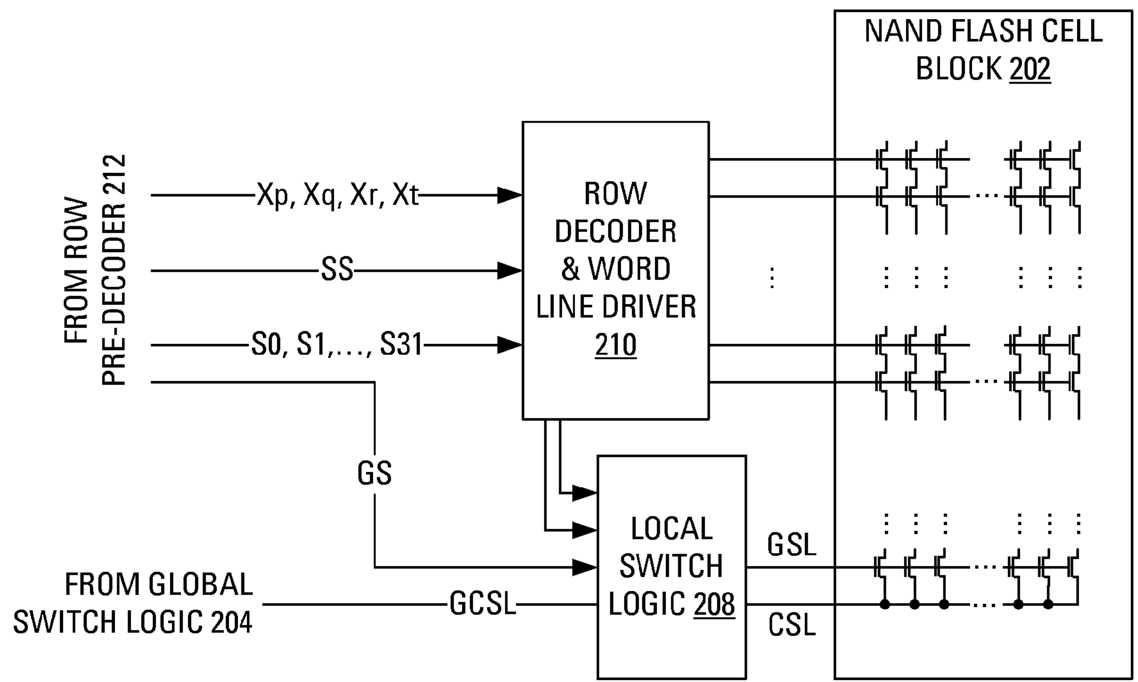
FIG. 3 is a block diagram of a single NAND flash cell block from FIG. 2 with associated local switch logic unit and combined row decoder and word line driver.

A closer look at an individual NAND flash cell block 202 is provided in FIG. 3. FIG. 3 allows identification of connections between the local switch logic unit 208 and the NAND flash cell block 202. In particular, a local Common Source Line (CSL) and a Ground Select Line (GSL) connect the local switch logic unit 208 to the NAND flash cell block 202.

Figure 4:
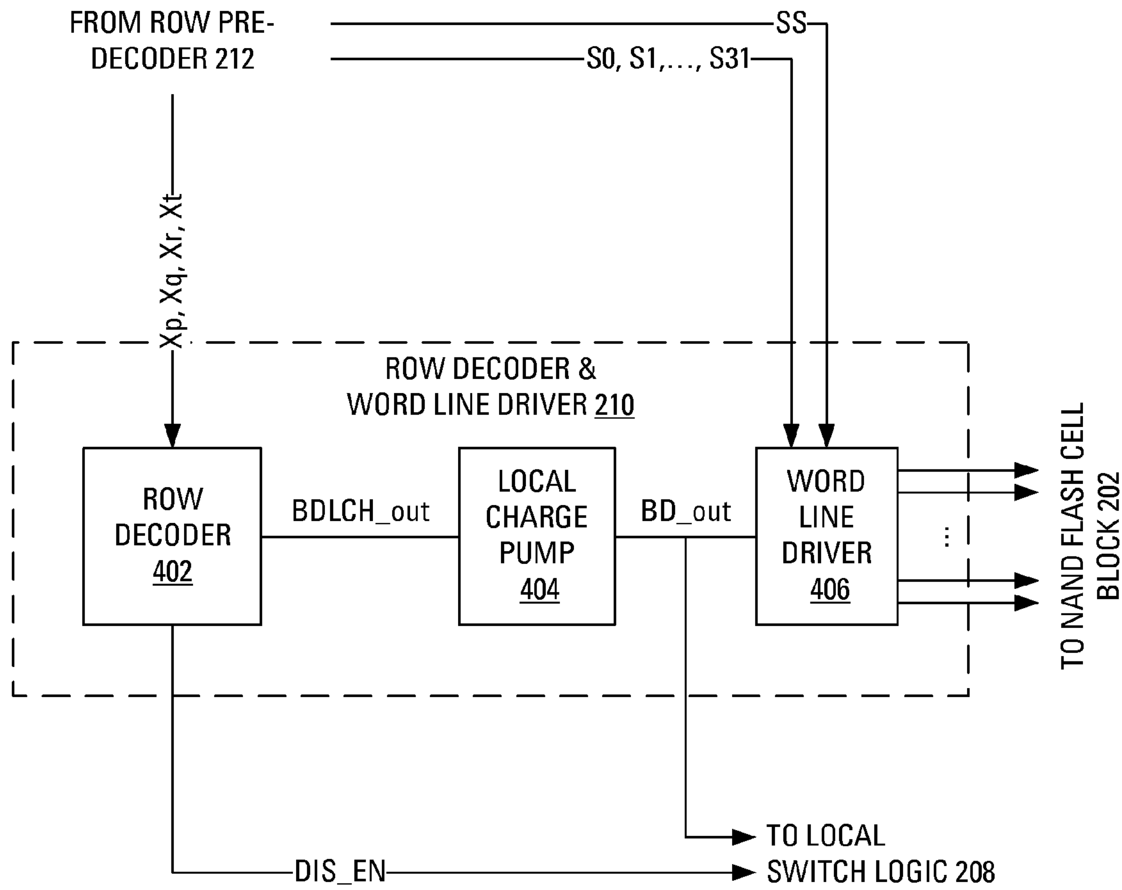
FIG. 4 is a block diagram of the combined row decoder and word line driver of FIG. 3 including a row decoder, a local charge pump and a word line driver.

The components of an example combination row decoder and word line driver 210 are presented in FIG. 4. As illustrated in FIG. 4, the combination row decoder and word line driver 210 includes a row decoder 402 connected to a local charge pump 404, which, in turn, is connected to a word line driver 406. The row decoder 402 is also connected to the row pre-decoder 212. The word line driver 406 is connected, by multiple word lines, to the associated NAND flash cell block 202. Additionally, the row decoder 402 and the local charge pump 404 maintain connections to the local switch logic unit 208.

As illustrated in FIG. 5A, the row decoder 402 includes an AND gate 502 arranged to receive pre-decoded row information from the row pre-decoder 212. The output of the AND gate 502 is received at the gate of a sense transistor 504. In one embodiment, the sense transistor 504 is an n-type Metal Oxide Semiconductor (NMOS) transistor. As is inherent in MOS transistors, the sense transistor 504 has a source and a drain. The source of the sense transistor 504 is connected to a source supply voltage. The drain of the sense transistor 504 is connected to the source of an NMOS latch enable transistor 506. The gate of the latch enable transistor 506 receives a LCHBD signal from one of a set of peripheral blocks (not shown). As can be seen upon review of the timing diagram of FIG. 5B, the LCHBD signal is a pulse that prevents a wrong decoding caused by glitches. The drain of the latch enable transistor 506 is connected to one of two terminals of an address latch 510. As illustrated, the address latch 510 is implemented as cross-coupled inverters. The other of the two terminals of the address latch 510 is connected to the drain of an NMOS reset transistor 508. The gate of the reset transistor 508 receives a RST_BD signal from the same peripheral block (not shown) from which the LCHBD signal is received. The RST_BD signal is a pulse that is generated before starting a new decoding operation. As can be seen upon review of the timing diagram of FIG. 5B, the RST_BD signal initializes "BDLCH_out" as a low state. The terminal of address latch 510 that connects to the drain of the NMOS reset transistor 508 may also be considered one of two outputs of the row decoder 402, "BDLCH_out". While the other of the two outputs of the row decoder 402, "DIS_EN", is taken from the drain of the latch enable transistor 506.

Figure 6:
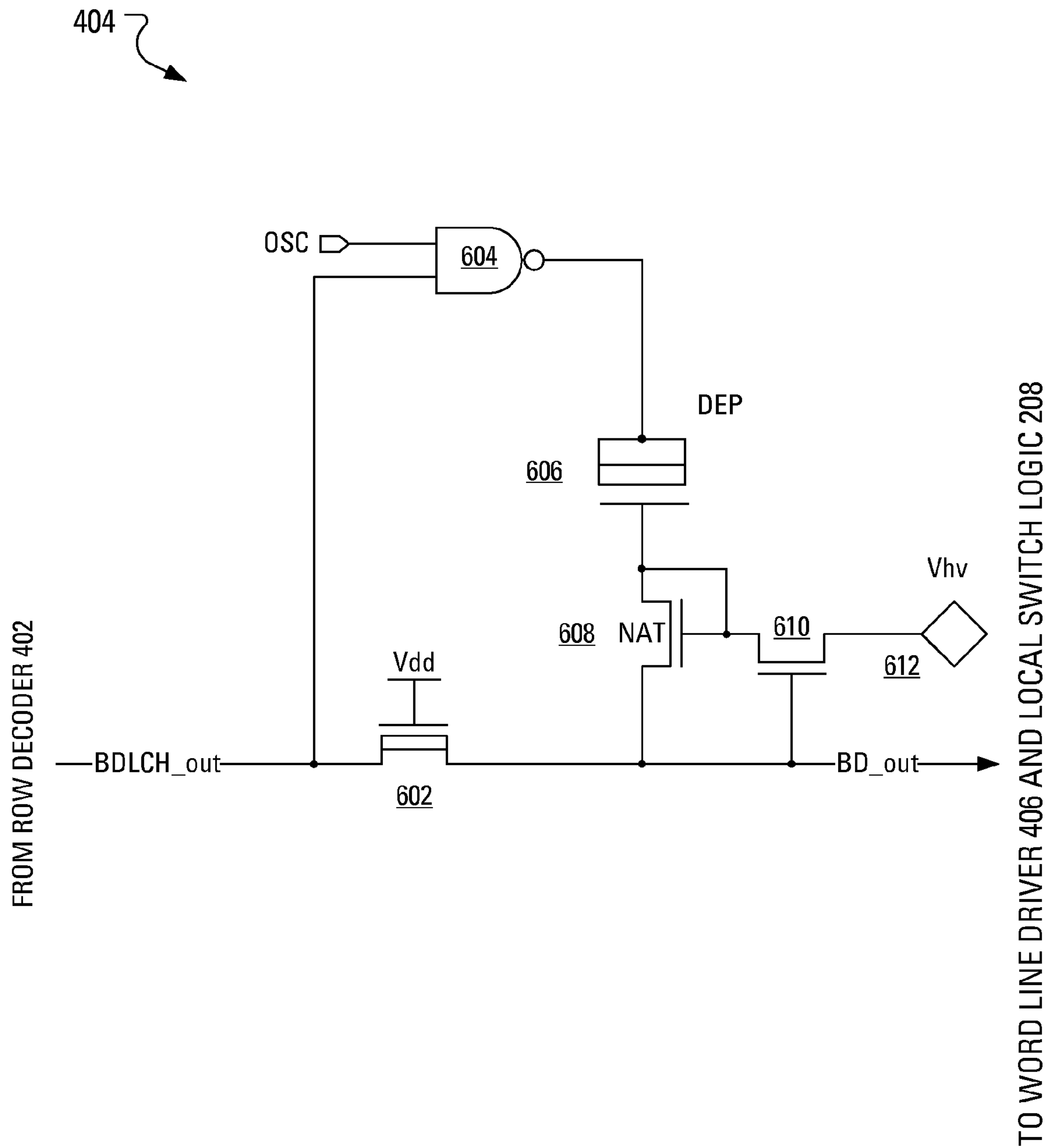
FIG. 6 is a schematic diagram of the local charge pump of FIG. 4.

In FIG. 6, the local charge pump 404 is illustrated as a high voltage switching means to control transistors in the word line driver 406 and the local switch logic unit 208. The local charge pump 404 typically consists of an enhancement NMOS transistor 610, two depletion NMOS transistors 602, 606, a native NMOS transistor 608 and a 2-input NAND gate 604. The output signal, "BD_out" of the local charge pump 404 is raised to $V_{hv}$ 612 when the address latch 510 output, BDLCH_out, is $V_{DD}$ and the OSC is oscillated (note: the local charge pump is a well known circuit). When the associated NAND flash cell block 202 is selected, BD_out=$V_{hv}$ 612. When the associated NAND flash cell block 202 is not selected, BD_out=$V_{SS}$.

Figure 7:
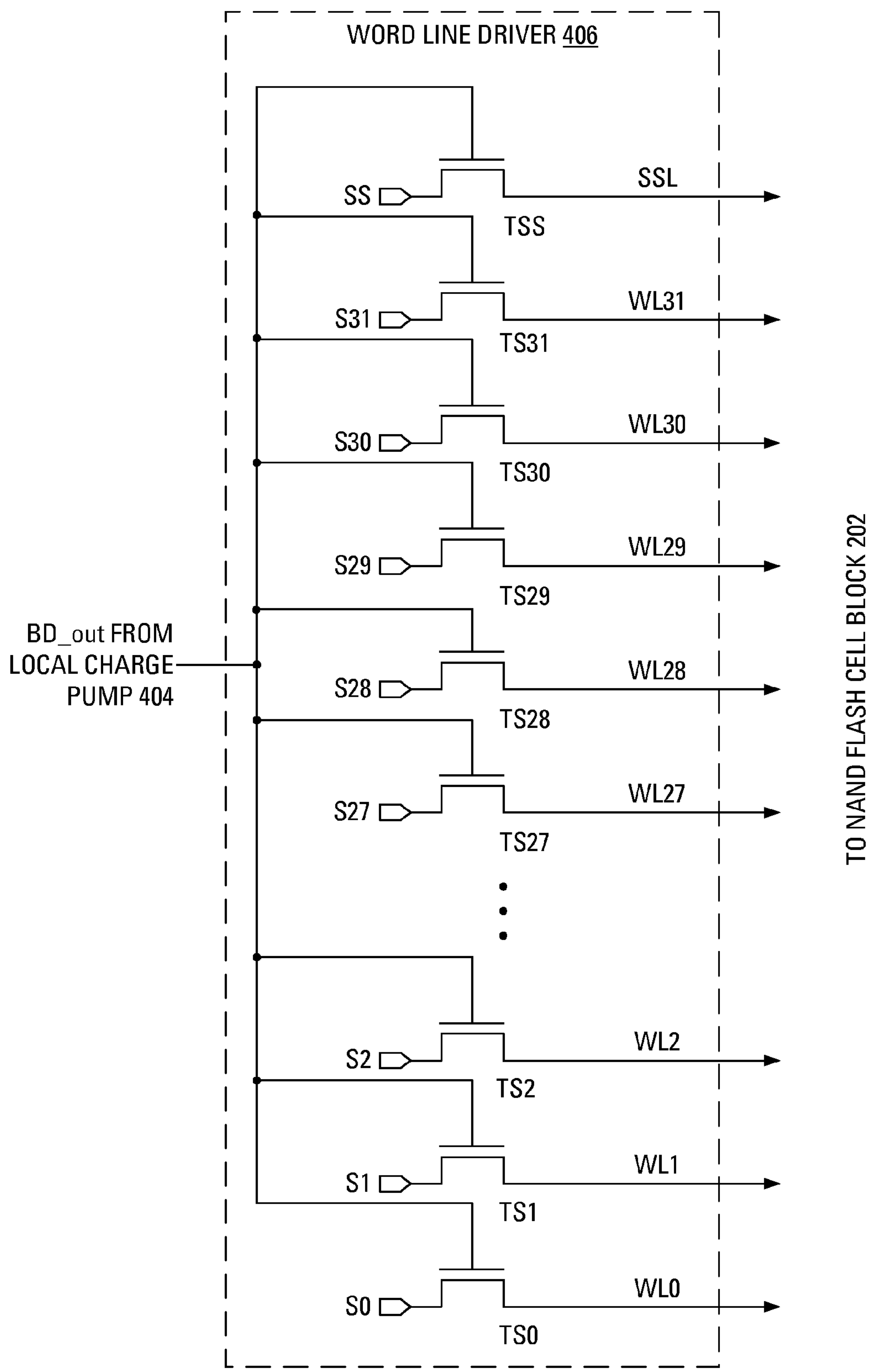
FIG. 7 is a schematic diagram of the word line driver of FIG. 4.

The BD_out signal is received by the word line driver 406, which is illustrated in detail in FIG. 7, and distributed to the gates of a plurality of NMOS transistors. Where there are 32 word lines, there are 33 NMOS transistors in the word line driver 406: one NMOS transistor corresponding to each wordline; and one string select NMOS transistor, TSS. For simplicity of illustration, only NMOS transistors TS0, TS1, TS2, . . . , TS27, TS28, TS29, TS30, TS31 corresponding to wordlines 0, 1, 2, 27, 28, 29, 30 and 31 are shown in FIG. 7.

In addition to the word line driver 406, the local switch logic unit 208 also provides input to the NAND flash cell block 202. Elements of the local switch logic unit 208 for use in the source-line page programming scheme are illustrated in FIG. 8. The local switch logic unit 208 includes a Ground Select Line (GSL) transistor 802. The GSL transistor 802 is illustrated in FIG. 8 as an NMOS transistor whose source receives a Ground Select (GS) signal from the row pre-decoder 212. Additionally, the local switch logic unit 208 includes a Common Source Line (CSL) transistor 804. The CSL transistor 804 is illustrated in FIG. 8 as an NMOS transistor whose source is connected to the main power source line (GCSL) level from the global switch logic unit 204. In common with the transistors of the word line driver 406, the BD_out signal from the local charge pump 404 is the signal on the gate of the GSL transistor 802 and on the gate of the CSL transistor 804. The DIS_EN signal received at the local switch logic unit 208 from the row decoder 402 is connected to the gate of a discharging transistor 806. The source of the discharging transistor 806 is grounded and the drain of the discharging transistor 806 is connected to the drain of the CSL transistor 804.

FIG. 9 illustrates elements of the NAND flash cell block 202. As is known, the NAND flash cell block 202 includes a plurality of NAND memory cell strings. An example NAND memory cell string is indicated in FIG. 9 by reference numeral 900. The example NAND memory cell string 900 includes a bit line 902 and 32 serial-connected floating gate memory cells, the floating gate of each of the floating gate memory cells being connected to respective word lines, referenced as WL0, WL1, WL2, . . . , WL30, WL31. An example floating gate memory cell, topmost among the 32 serial-connected floating gate memory cells, is indicated in FIG. 9 by reference numeral 931. The example NAND memory cell string 900 also includes a string selector transistor 904 having a drain connected to the bit line 902 and a source connected to the drain of the example floating gate memory cell 931. The gate of the string selector transistor 904 is connected to the string selection line (SSL) received from the word line driver 406.

The example NAND memory cell string 900 includes a ground select transistor 906 with a drain connected to the source of the bottommost floating gate memory cell among the 32 serial-connected floating gate memory cells. The source of the ground select transistor 906 is connected to the CSL received from the local switch logic unit 208. The gate of the ground select transistor 906 is connected to the GSL received from the row pre-decoder 212.

The example NAND memory cell string 900 connects to a 2-dimensional shared page buffer 910-0 through an odd bit select line (BSLo) transistor 908. The example NAND memory cell string 900 is paired with a further NAND memory cell string, which connects to the 2D shared page buffer 910-0 through an even bit select line (BSLe) transistor 912. Even though the bit lines are placed in column direction, logically a flash memory cell is selected, in part, by row address. For the example of FIG. 9, where NAND memory cell strings are paired and associated with 2D shared page buffers 910, physically, word lines are 32 but, logically, there are 64 word lines. When the row address of a memory cell of interest is odd, a high BSLo value is applied at the gate of the odd bit select line transistor 908, thereby selecting the example NAND memory cell string 900, which is associated with the odd $0^{th}$ bit line "B/L0*o*". When read operation is issued, a low BSLe value is applied to the gate of the even bit select line transistor 912, thereby unselecting the NAND memory cell string that is associated with the even $0^{th}$ bit line, "B/L0*e*".

Other paired NAND memory cell strings are associated with: an even $32767^{th}$ bit line, "B/L32767*e*", an odd $32767^{th}$ bit line, "B/L32767*e*", and a $32767^{th}$ 2D shared page buffer 910-32767; and an even $34511^{th}$ bit line, "B/L34511*e*", an odd $34511^{th}$ bit line, "B/L34511*e*", and a $34511^{th}$ 2D shared page buffer 910-34511.

In overview, in the array 200 of FIG. 2, only a selected NAND flash cell block 202 receives a value on the CSL that is indicative of the value on the GCSL. The CSLs of non-selected NAND flash cell blocks are disabled through connection to ground.

In operation, power for the global switch logic unit 204 is received from the source line power generator 206. The global switch logic unit 204 outputs a voltage level on the GCSL. The signal on the GCSL is received by each of the local switch logic units 208. A NAND flash cell block 202 is selected based on the output of the row pre-decoder 212.

The row decoder and word line driver 210 associated with the selected NAND flash cell block 202 generates a $V_{pgm}$ level as BD_out. Responsive to the $V_{pgm}$ level on BD_out, the local switch logic unit 208 associated with the selected NAND flash cell block 202 passes, on the CLS, the signal that has been received on the global common source line.

The combination row decoder and word line driver 210 associated with each of the selected NAND flash cell blocks 202 generates a $V_{DD}$ level on DIS_EN. Responsive to the $V_{DD}$ level on DIS_EN, the local switch logic unit 208 associated with the selected NAND flash cell block 202 biases the discharging transistor 806 such that the CLS is at ground.

Figure 10:
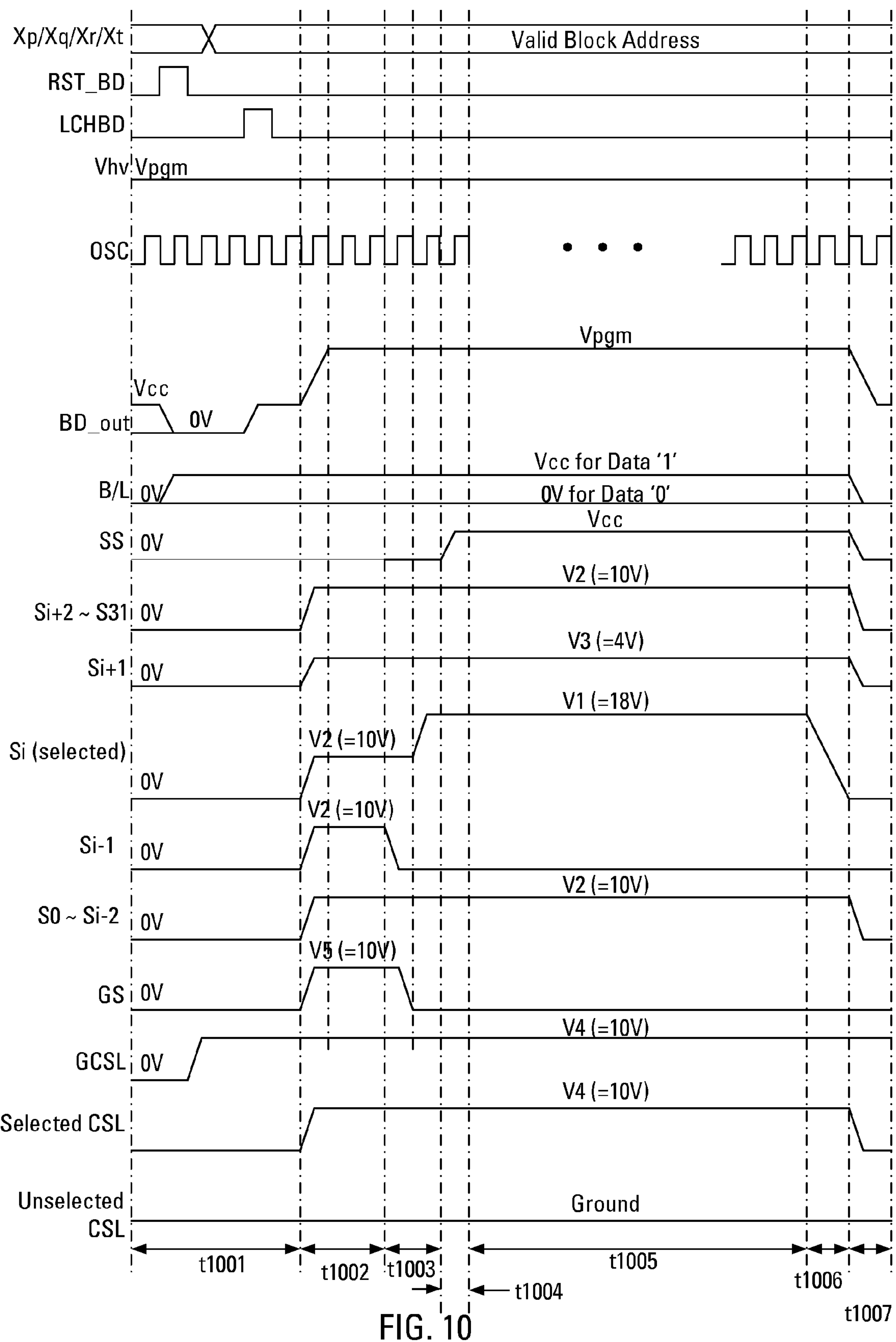
FIG. 10 is a timing diagram for the NAND flash cell block with associated local switch logic unit and combined row decoder and word line driver of FIG. 3.

FIG. 10 illustrates a timing diagram for the row decoder 402 and the local switch logic unit 208 corresponding to a scenario wherein the NAND flash cell block 202 of FIG. 3 is the selected NAND flash cell block. The structure may be termed "hierarchical" because, at given times, one NAND flash cell block 102 is promoted above the remaining NAND flash cell blocks.

A Program Setup phase is identified in FIG. 10 as t1001. In the Program Setup phase t1001, the block decoder 402 is reset through the application of a pulse on the RST_BD line. The level of the BDLCH_out output of the address latch 510 in the block decoder 402 goes to 0V. The latch enable signal LCHBD of the block decoder 402 is pulsed once row pre-decoded signals Xp/Xq/Xr/Xt are valid. The BDLCH_out of the address latch 510 rises to $V_{DD}$ when row pre-decoded signals Xp/Xq/Xr/Xt are matched. In the local charge pump 404, $V_{hv}$ is set to $V_{pgm}$ during entire program period (t1 to t7) covered by FIG. 10. Responsive to the pulse on the RST_BD line, the BD_out associated with each of the unselected NAND flash cell blocks 202 reduces to 0V. As a result, all wordlines WL0, WL1, WL2, . . . , WL30, WL31, the SSL, the GSL and the CSL in unselected blocks are floated.

In a NAND String Precharge phase, identified in FIG. 10 as t1002, the local switch logic unit 208 receives an indication of selection of the corresponding NAND flash cell block 202. That is, the output signal BD_out of the row decoder and word line driver 210 is raised to $V_{pgm}$ (=18V) in the local charge pump 404. Responsive to the application of the $V_{pgm}$ level BD_out to the gate of the CSL transistor 804, the CSL transistor 804 permits passage of a signal received on the GCSL to the selected NAND flash cell block 202 on the CSL, accordingly, the CSL rises to V4 (=10V). At the same time as the signal on BD_out is raised to $V_{pgm}$, the signal on DIS_EN from the drain of the latch enable transistor 506 of the row decoder 402 is reduced to ground, thereby turning off the discharging transistor 806 and isolating the CSL from ground. The ground on DIS_EN may be considered an enable indication.

For NAND flash cell blocks 202 that are not selected, BD_out remains at ground and a local switch logic unit 208 associated with an unselected NAND flash cell block 202 may consider that the ground on BD_out is an indication that the associated NAND flash cell block 202 has not been selected. Owing to the ground BD_out signal on the gate of the CSL transistor 804, the CSL transistor 804 remains off and the GCSL is isolated from the CSL of the associated NAND flash cell block 202. At the same time as the signal on BD_out is reduced to ground, the signal on DIS_EN from the drain of the latch enable transistor 506 of the row decoder 402 is increased, thereby turning on the discharging transistor 806 and connecting the CSL to ground. The high voltage level on DIS_EN may be considered a disable indication.

The change in BD_out turns on all of the transistors TSS, TS0 to TS31 of the word line driver 406 as well as the GSL transistor 802 and the CSL transistor 804. All S signals except Si+1 rise to V2 ($V_{pass}$=10V) while Si+1 rises to V3 ($V_{dcp}$=4V) and the signal on the GSL rises to V5 ($V_{gsl}$=10V). By the end of the NAND String Precharge phase t1002, a selected NAND memory cell string may be considered to be precharged. The level on the CSL output from the local switch logic unit 208 associated with the selected NAND flash cell block 202 follows the level of GCSL.

In a Boosting phase, identified in FIG. 10 as t1003, the Si−1 returns to 0V, the signal on the GSL returns to 0V, the selected Si rises to V1 ($V_{pgm}$=18V) and the channel of the selected floating gate memory cell in the NAND memory cell string is locally boosted from the precharged level.

In a Bit Line Data Load phase, identified in FIG. 10 as t1004, the SS rises to $V_{CC}$ to load the bit line voltage to the selected NAND string. If the program data is 1, the bit line voltage is $V_{CC}$, which maintains precharged and boosted channel voltage in the selected floating gate memory cell. If the program data is 0, the bit line voltage is 0V, which discharges the precharged and boosted channel voltage in the selected floating gate memory cell.

Notably, a Program phase, identified in FIG. 10 as t1005, has a longer duration than the other phases identified in FIG. 10. During the Program phase t1005, all signal levels are maintained.

In first portion of a Program Recovery phase, identified in FIG. 10 as t1006, the Si corresponding to the selected word-line may be discharged to 0V to avoid accidental programming during program recovery. In second portion of the Program Recovery phase, identified in FIG. 10 as t1007, all of the remaining signals in the core, including the signal on the CSL, are discharged.

As will be clear to a person of ordinary skill in the art, the CSL transistor 804 and the discharging transistor 806 need not necessarily be NMOS transistors and, according to the fabrication methods used in the related array, may be selected from among many types of semiconductor switches.

Therefore, the hierarchical common source line structure bias control described herein may provide two major benefits. One benefit may be a reduced power consumption. Another benefit may be fast discharge of source line programming level (GCSL) to ground because the CSL associated with the selected NAND flash cell block 202 has a high voltage level while the CSLs associated with remaining NAND flash cell blocks 202 have a ground level by the placement and activation of the discharging transistor 806. As will be clear to a person of ordinary skill in the art, the GCSL "sees" a significantly reduced capacitive load in the structure described above than in the structure in which the GCLS is provided to all NAND flash memory blocks.

The above-described embodiments of the present application are intended to be examples only. Alterations, modifications and variations may be effected to the particular embodiments by those skilled in the art without departing from the scope of the application, which is defined by the claims appended hereto.

What is claimed is:

1. A local switch logic unit for reducing power consumption from source-line page programming in a memory device which comprises a plurality of NAND Flash memory blocks,
- wherein each one of said plurality of NAND Flash memory blocks is coupled to one of said local switch logic unit and connected to a local common source line, said local switch logic unit comprising:
- a first semiconductor switch for selectively allowing passage of a signal received on a global common source line to said one of said plurality of NAND Flash blocks on said local common source line; and
- a second semiconductor switch for selectively placing a predetermined voltage on said local common source line.

2. The local switch logic unit of claim 1 wherein said first semiconductor switch is an n-type Metal Oxide Semiconductor (NMOS) transistor.

3. The local switch logic unit of claim 2 wherein said second semiconductor switch is an n-type Metal Oxide Semiconductor (NMOS) transistor.

4. The local switch logic unit of claim 1 further comprising a first input line for receiving a voltage level indicative of selection of said one of said plurality of NAND flash memory blocks.

5. The local switch logic unit of claim 1 further comprising a second input line for receiving a voltage level indicative of said one of said plurality of NAND flash memory blocks not having been selected.

6. The local switch logic unit of claim 1 wherein said predetermined voltage is ground.

7. A method of reducing power consumption from source-line page programming in a memory device which comprises a plurality of NAND Flash memory blocks,
- wherein each one of said plurality of NAND Flash memory blocks is coupled to a local switch logic unit and connected to a local common source line, said method comprising:
- receiving an indication of selection of said one of said plurality of NAND flash memory blocks;
- responsive to receiving said indication of selection, permitting passage of a signal received on a global common source line to said one of said plurality of NAND flash memory blocks on said local common source line;
- receiving an enable indication; and
- responsive to receiving said enable indication, isolating said local common source line from a predetermined voltage.

8. The method of claim 7 wherein said predetermined voltage is ground.

9. A method of reducing power consumption from source-line page programming in a memory device which comprises a plurality of NAND Flash memory blocks,
- wherein each one of said plurality of NAND Flash memory blocks is coupled to a local switch logic unit and connected to a local common source line, said method comprising:
- receiving an indication that said one of said plurality of NAND flash memory blocks has not been selected;
- responsive to receiving said indication, isolating a global common source line from said local common source line of said one of said plurality of NAND flash memory blocks;
- receiving a disable indication; and
- responsive to receiving said disable indication, connecting said local common source line to a predetermined voltage.

10. The method of claim 9 wherein said predetermined voltage is ground.

11. A memory array comprising:
- a plurality of NAND Flash memory blocks, each one of said plurality of NAND Flash memory blocks including a plurality of NAND Flash memory strings, each plurality of NAND Flash memory strings coupled to a local switch logic unit and connected to a local common source line;
- the local switch logic unit including:
- a first semiconductor switch for selectively allowing passage, on said local common source line, of a signal to said plurality of NAND flash memory strings in said one of said plurality of NAND flash memory blocks, wherein said signal is received on a global common source line; and
- a second semiconductor switch for selectively placing a predetermined voltage on said local common source line.

12. The memory array of claim 11 wherein said first semiconductor switch is an n-type Metal Oxide Semiconductor (NMOS) transistor.

13. The memory array of claim 12 wherein said second semiconductor switch is an n-type Metal Oxide Semiconductor (NMOS) transistor.

14. The memory array of claim 11 wherein said local switch logic further comprises a first input line for receiving a voltage level indicative of selection of said one of said plurality of NAND Flash memory blocks.

15. The memory array of claim 14 further comprising, associated with said one of said plurality of NAND Flash memory blocks, a row decoder adapted to receive row pre-decoded signals and, based on said row pre-decoded signals, provide, on said first input line, said voltage level indicative of selection of said one of said plurality of NAND Flash memory blocks.

16. The memory array of claim 15 wherein said local switch logic further comprises a second input line for receiving a voltage level indicative of said one of said plurality of NAND Flash memory blocks not having been selected.

17. The memory array of claim 16 further comprising, associated with said one of said plurality of NAND Flash memory blocks, a local charge pump adapted to receive, from said row decoder, a latch signal, and, based on said latch signal, provide, to said second input line, said voltage level indicative of selection of said one of said plurality of NAND Flash memory blocks not having been selected.

18. The memory array of claim 17 wherein said local switch logic unit further includes a third semiconductor switch for selectively allowing passage, on a ground select line, of a ground select signal to said plurality of NAND Flash memory strings in said one of said plurality of NAND Flash memory blocks.

19. The memory array of claim 18 wherein said passage of said ground select signal is based on said latch signal on said second input line.

20. The memory array of claim 11 wherein said predetermined voltage is ground.

* * * * *